US012560727B2

(12) United States Patent
Koo et al.

(10) Patent No.: US 12,560,727 B2
(45) Date of Patent: Feb. 24, 2026

(54) OPTICAL WAVEGUIDE SENSOR FOR DETECTING RADIOACTIVE ISOTOPES AND METHOD OF FABRICATING THE SAME

(71) Applicant: Vulcan Photonics Sdn. Bhd., Kuala Lumpur (MY)

(72) Inventors: Khong Nee Koo, Pulau Pinang (MY); Farah Hidayah Binti Jamaludin, Johor (MY); Evianie Bingak Edward, Johor (MY); Mun Oon Fong, Pulai Pinang (MY)

(73) Assignee: Vulcan Photonics Sdn. Bhd., Kuala Lumpur (MY)

( * ) Notice: Subject to any disclaimer, the term of this patent is extended or adjusted under 35 U.S.C. 154(b) by 0 days.

(21) Appl. No.: 18/578,103

(22) PCT Filed: Dec. 29, 2022

(86) PCT No.: PCT/MY2022/050134
§ 371 (c)(1),
(2) Date: Jan. 10, 2024

(87) PCT Pub. No.: WO2024/144386
PCT Pub. Date: Jul. 4, 2024

(65) Prior Publication Data
US 2025/0093532 A1 Mar. 20, 2025

(51) Int. Cl.
G01T 1/04 (2006.01)
C23C 16/02 (2006.01)
(Continued)

(52) U.S. Cl.
CPC ............. G01T 1/04 (2013.01); C23C 16/0227 (2013.01); C23C 16/50 (2013.01); G01T 1/023 (2013.01)

(58) Field of Classification Search
CPC ....... G01T 1/04; G01T 1/023; C23C 16/0227; C23C 16/50; G21K 2004/06; G21K 2004/08; G21K 2004/12; G21K 4/00
See application file for complete search history.

(56) References Cited

U.S. PATENT DOCUMENTS 10,877,164 B2 12/2020 Archibald et al.
2010/0084561 A1 4/2010 Tranter et al.
(Continued)

FOREIGN PATENT DOCUMENTS

JP 6105712 B2 * 3/2017 ......... G01T 1/20185
KR 10-2012-0039345 4/2012

*Primary Examiner* — Kiho Kim
(74) *Attorney, Agent, or Firm* — Head, Johnson, Kachigian & Wilkinson, PC

(57) ABSTRACT

The present invention relates to a method for forming an optical waveguide sensor for detecting ions containing radioactive isotopes in an aqueous solution. The method comprises treating a substrate surface by cleaning the substrate surface with one or more solvents to enable coating with a crosslinking agent, the substrate being selected from silica or silicon substrate, coating the treated substrate surface with the crosslinking agent selected from carboxylic acid functional group containing organic molecules to form a crosslinked substrate surface, coating the crosslinked substrate surface with a scintillating agent, and coating the substrate surface with a ligand capable of reacting with a radioactive isotope in an aqueous solution to form a functionalized substrate surface. The present invention also relates to the optical waveguide sensor for detecting radioactive isotopes fabricated with the method of the present invention.

17 Claims, 5 Drawing Sheets

Legend:
\ Di- or Poly carboxylic acid crosslinkers
■ Di- or Poly alcohol crosslinker complexes
○ Ligand containing carboxylic acid groups
△ Ligand containing amine groups

(51) Int. Cl.
    *C23C 16/50*       (2006.01)
    *G01T 1/02*       (2006.01)

(56)            References Cited

U.S. PATENT DOCUMENTS

| | | | |
|---|---|---|---|
| 2020/0326300 | A1 | 10/2020 | Aran et al. |
| 2022/0299658 | A1 | 9/2022 | Scherer et al. |

* cited by examiner

10ppm

1. Pretreatment

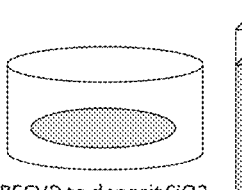 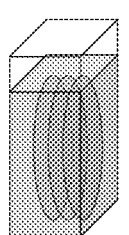

PECVD to deposit SiO2
on silicon substrate
at < 0.1 Torr vacuum

Cleaning of substrates
in IPA and acetone
in developing tank

2. Coating of carboxylic acid
brushes

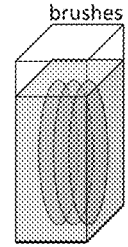

Coating of substrates
in temperature controlled
developing tank (40 - 70 °C)
containing di- or poly
carboxylic acid crosslinkers 3. Washing

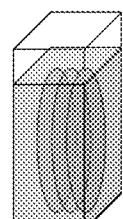

Cleaning of substrates
in water and IPA
in developing tank

4. Coating of scintillating
agent

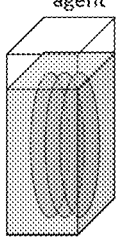

Coating of substrates
in temperature controlled
developing tank (40 - 70 °C)
containing di- or poly
alcohol complexes 5. Washing

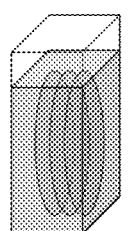

Cleaning of substrates
in water and IPA
in developing tank

6. Coating of ligands

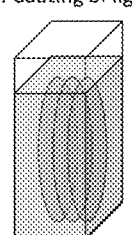

Coating of substrates
in temperature controlled
developing tank (40 - 70 °C)
containing ligands
with carboxylic acid groups 7. Washing

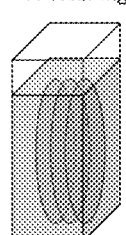

Cleaning of substrates
in water and IPA
in developing tank

FIGURE 4A

1. Pretreatment

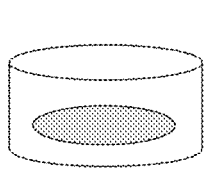
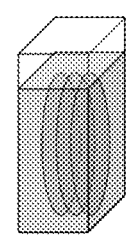

PECVD to deposit SiO2
on silicon substrate
at < 0.1 Torr vacuum    Cleaning of substrates
in IPA and acetone
in developing tank 2. Coating of carboxylic acid
brushes

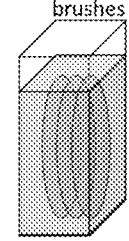

Coating of substrates
in temperature controlled
developing tank (40 - 70 °C)
containing di- or poly
carboxylic acid crosslinkers 3. Washing

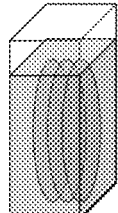

Cleaning of substrates
in water and IPA
in developing tank

4. Coating of scintillating
agent

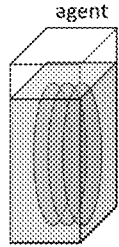

Coating of substrates
in temperature controlled
developing tank (40 - 70 °C)
containing di- or poly
alcohol complexes 5. Washing

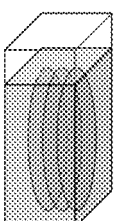

Cleaning of substrates
in water and IPA
in developing tank

6. Coating of carboxylic
acid crosslinkers

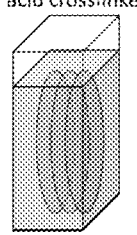

Coating of substrates
in temperature controlled
developing tank (40 - 70 °C)
containing crosslinkers
with carboxylic acid groups 7. Washing

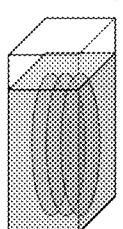

Cleaning of substrates
in water and IPA
in developing tank

8. Coating of amine ligands

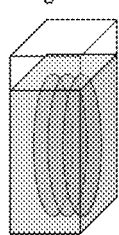

Coating of substrates
in temperature controlled
developing tank (4 - 30 °C)
containing ligands with amine
groups, EDC and NHS 9. Washing

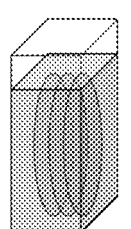

Cleaning of substrates
in water and IPA
in developing tank

OPTICAL WAVEGUIDE SENSOR FOR DETECTING RADIOACTIVE ISOTOPES AND METHOD OF FABRICATING THE SAME

FIELD OF INVENTION

The present invention generally relates to detection of radioactive isotopes, and more particularly to an optical waveguide sensor and method for fabricating the optical waveguide sensor for detecting radioactive isotopes in an aqueous solution.

BACKGROUND

Radioactive isotopes also known as radioisotopes, radio-nuclides, or radioactive nuclides are atoms that contain unstable combinations of neutrons and protons. Radioactive isotopes release energy in the form of alpha ($\alpha$), beta ($\beta$), and gamma ($\gamma$) radiations until they reach a stable form. Exposure to such radiation is harmful to human health as it can cause skin damage, cataracts, cancer, and even death. Radiation from radioactive isotopes may also affect the environment and cause radioactive pollution. Hence, detection and quantification of radioactive ions and isotopes are crucial for both human health and environmental protection.

Optical thin-film sensors have recently been used for detection of potentially hazardous chemical ions due to numerous advantages such as compact size, lightweight, inexpensive, fast response time and flexibility for in-situ or remote monitoring. Radioactive ions can be detected through the thin-film coating of material that is selectively reactive to the specific ions.

U.S. Patent Publication No. U.S. Pat. No. 7,776,611 B2 relates to functionalized composite materials having selective absorption for specific analytes, methods for the preparation of such materials as films, and optical sensors employing such films for optical detection of analytes. Although the employment of thin-film coating has been disclosed, there is still a difficulty in forming a uniform layer of the thin-film coating in the sensing region of the optical sensor. Non-uniform coating layer often results in non-repeatability and non-reproducibility of the optical sensor.

Furthermore, the sensors and methods currently disclosed in the prior art for detecting radioactive ions typically involve the use of silylating agents that are prone to react with the silicon or silica substrate surface of the sensor device, resulting in agglomeration that decreases surface uniformity. Other than that, the currently available sensors are unable to detect both the radioactive ions and their radioisotopes, and are bulky, complicated and costly to fabricate. Therefore, the present invention aims to provide an improved optical waveguide sensor for detecting radioactive isotopes and method of fabricating the same that can overcome or mitigate at least some of the aforementioned problems of the prior art.

SUMMARY

The following presents a simplified summary of the invention in order to provide a basic understanding of some aspects of the invention. This summary is not an extensive overview of the invention. Its sole purpose is to present some concepts of the invention in a simplified form as a prelude to the more detailed description that is presented later.

In one aspect, the present invention provides a method for forming an optical waveguide sensor for detecting ions containing radioactive isotopes in an aqueous solution, the method comprising the steps of treating a substrate surface by cleaning the substrate surface with one or more solvents for enabling coating of the treated surface with a crosslinking agent, the substrate being selected from a group comprising a silica or a silicon substrate, coating the treated substrate surface with the crosslinking agent selected from a group comprising carboxylic acid functional group containing organic molecules for forming a crosslinked substrate surface, coating the crosslinked substrate surface with a scintillating agent for forming a substrate surface containing scintillating agent, and coating the substrate surface containing scintillating agent with a ligand capable of reacting with a radioactive isotope in an aqueous solution for forming a functionalized substrate surface, thereby forming the optical waveguide sensor comprising a layer of the ligand and the scintillating agent, The method of the present invention can be characterized by coating the treated substrate surface with the crosslinking agent using a tin catalyst. Further, it is preferred for the scintillating agent to be selected from a group comprising a fluorescent crosslinker complex selected from a group comprising a hydroxyl functional group containing organic molecules complexed with ions selected from a group comprising Europium ions, $Eu^{3+}$, nickel ions, $Ni^{2+}$, or copper ions, $Cu^{2+}$, and the ligand to be selected from a group comprising carboxylic acid functional group containing organic molecules or an amine functional group ligand, wherein the selection of the ligand varies depending on the type of substrate surface and the types of ions containing radioactive isotopes to be detected. The optical waveguide sensor is configured to be interactable with a light wave passing through the optical waveguide sensor from an input and an aqueous solution for determining concentration of the ions containing radioactive isotope in the aqueous solution, whereby, upon adsorption of the ions containing the radioactive isotope from the aqueous solution on the surface of the optical waveguide sensor, the molecules of the scintillating agent fluoresce in response to the ionizing radiation from the radioactive isotope of varying measurable intensity, and triggers a measurable change in material optical refractive index of the ligand of the functionalized substrate surface, which change corresponds to the absorption kinetics and radioactivity of the ions and its radioactive isotope.

Advantageously this allows the radioactive isotope to be identified and quantified with consistency as the method ensures that the sensor surface is uniform.

Typically, the one or more solvents is selected from the group comprising deionized water, ethanol, acetone, isopropanol, or combination thereof.

Typically, the silicon substrate is further treated by coating a layer of silicon dioxide on the silicon substrate surface, prior to cleaning the substrate surface.

Typically, the silicon substrate is coated with the crosslinking agent comprising di- or poly carboxylic acid molecules, selected from a group comprising malic acid, oxalic acid, glutaric acid, succinic acid, tannic acid or polyacrylic acid, via esterification, for forming the crosslinked substrate surface.

Typically, the hydroxyl functional group containing organic molecules is selected from a group comprising 7-Dihydroxy-1,10-phenanthroline or Luminol.

In another embodiment, the ligand comprising carboxylic acid functional group containing organic molecules is selected from a group comprising a 4'-Carboxybenzo-18-crown 6-Ether or a Copper-Ethylenediaminetetraacetic acid complex.

Typically, the ions containing radioactive isotopes detectable by the functionalized substrate surface is selected from the group comprising radium or fluoride, which are adsorbed by the functionalized substrate surface upon exposure to the ions from the aqueous solution, consequently changing the material optical refractive index of the functionalized substrate surface.

In yet another embodiment, the method further comprises the steps of coating the substrate surface containing scintillating agent with another di- or poly carboxylic acid molecules selected from a group comprising malic acid, oxalic acid, glutaric acid, succinic acid, tannic acid or polyacrylic acid via esterification for forming a double crosslinked substrate surface for enabling coating of an amine functional group ligand for forming a second functionalized substrate surface, wherein the amine functional group ligand is selected from a group comprising 4'-Aminobenzo-24-crown-8, 4'-Aminobenzo-18-crown-6,4,7,13,16,21,24-Hexaoxa-1,10-diazabicyclo[8.8.8]hexacosane-, or 5,6-Benzo-4,7,13,16,21,24-hexaoxa-1,10-diazabicyclo[8.8.8] hexacos-5-ene-.

Typically, the amine group is coated to the double crosslinked substrate surface via amine conjugation using 1-Ethyl-3-(3-dimethylaminopropyl)-carbodiimide) (EDC) and N-Hydroxysuccinimide (NHS).

In a further embodiment, the ions containing radioactive isotopes detectable by the optical waveguide sensor containing the amine functional group ligand is selected from the group comprising cesium, or radium which are adsorbed by the second functionalized substrate surface, consequently changing the material optical refractive index of the second functionalized substrate surface.

Typically, the scintillating agent is coated to the crosslinked substrate surface via esterification.

Typically, the esterification or the amine conjugation steps are repeatable for increasing numbers of binding sites on the functionalized silicon substrate and the second functionalized silicon substrate.

Advantageously, the method of the present invention avoids the use of silylating agents to couple the ligands onto the substrate surface containing scintillating agent, resulting in a uniform thin film coating of ligand onto the substrate and therefore allowing for repeatability and reproducibility of the optical waveguide sensor. The present invention involves a layer-by-layer reaction whereby the substrate is first coated with carboxylic acid groups crosslinking agent and therefore only reacts with the silica present on the treated silicon or silica substrate via the Fischer esterification reaction, which thus eliminates the possibility of agglomeration and improves the surface uniformity.

Advantageously, the coating of di- or poly carboxylic acid molecules results in a substrate surface with varying amount of carboxylic acid groups, which provides possibilities for coupling with hydroxyl functional group scintillating agent, carboxylic acid functional group ligand, and amine group ligand, resulting in tuneable sensitivity and concentration range of the waveguide sensor, as more binding sites on the sensor allows for more ions containing radioactive isotope to bind with the scintillating agent and the ligands on the functionalized substrate to produce signal change in the sensor.

In another aspect, there is provided an optical waveguide sensor for detecting ions containing radioactive isotopes in aqueous solution, wherein the optical wave guide sensor is fabricated by the steps of any of the abovementioned method.

In yet another aspect, there is provided an optical waveguide sensor comprising a substrate surface having a uniform thin layer of crosslinking agent, scintillating agent and ligand coupled thereto for forming a functionalized substrate surface, the substrate being selected from a group comprising a silica or a silicon substrate. The optical waveguide sensor can be characterized by the substrate surface being coated with the crosslinking agent selected from a group comprising carboxylic acid functional group containing organic molecules, the substrate surface being coated with the scintillating agent comprising a fluorescent crosslinker complex containing di- or poly alcohol molecules complexed with Europium ions, $Eu^{3+}$, nickel ions, $Ni^{2+}$, or copper ions, $Cu^{2+}$, and the substrate surface coated with the scintillating agent being coupled with the ligand via esterification, wherein the ligand is selected from a group comprising carboxylic acid functional group containing organic molecules or an amine functional group, whereby the selection of the ligand varies depending on the type of substrate surface and the type of ions containing radioactive isotopes to be detected.

Typically, the optical waveguide sensor is configured to be interactable with a light wave from an input of the optical waveguide sensor and an aqueous solution in contact with the functionalized substrate surface for determining concentration of ions containing radioactive isotopes in the aqueous solution, whereby the ions containing radioactive isotopes in the aqueous solution are adsorbed by the functionalized substrate surface, causing the molecules of the scintillating agent to fluoresce upon receiving ionizing radiation from the radioactive isotope, and changing the material optical refractive index of the functionalized substrate surface, wherein the change of the material optical refractive index fluorescence and correspond to the concentration of the ions and its radioactive isotope.

In an embodiment, the carboxylic acid functional group is coupled to the substrate through esterification for forming a crosslinked substrate surface, thereby enabling coating of the crosslinked substrate surface with a scintillating agent for forming a substrate surface containing scintillating agent via another esterification.

In another embodiment, the substrate surface containing scintillating agent is coated with the ligand selected from the group comprising a carboxylic acid functional group containing organic molecules for forming a functionalized substrate surface or the amine functional group for forming a second functionalized substrate surface.

Advantageously, the sensitivity and detection range of the optical waveguide sensor can be tuned by modifying the crosslinkers and ligands used in forming the functionalized substrate. The additional crosslinkers used for fabricating the second functionalized substrate surface provides additional binding sites to the optical waveguide sensor, thereby modifying the sensitivity and detection range of the optical waveguide sensor. The Fisher esterification or amine conjugation can be repeated to add more crosslinkers and more ligands for increasing the number of binding sites. The simple processes used for forming the functionalized substrate may potentially ease mass production of the optical waveguide sensor.

BRIEF DESCRIPTION OF DRAWINGS

For the purpose of facilitating an understanding of the invention, there is illustrated in the accompanying drawings the preferred embodiments from an inspection of which when considered in connection with the following description, the invention, its construction and operation and many of its advantages would be readily understood and appreciated.

FIGS. 4A and 4B illustrate examples of the method for fabricating the optical wave guide having the first and second functionalized substrate surface, respectively, according to the present invention.

DETAILED DESCRIPTION

Figure 1:
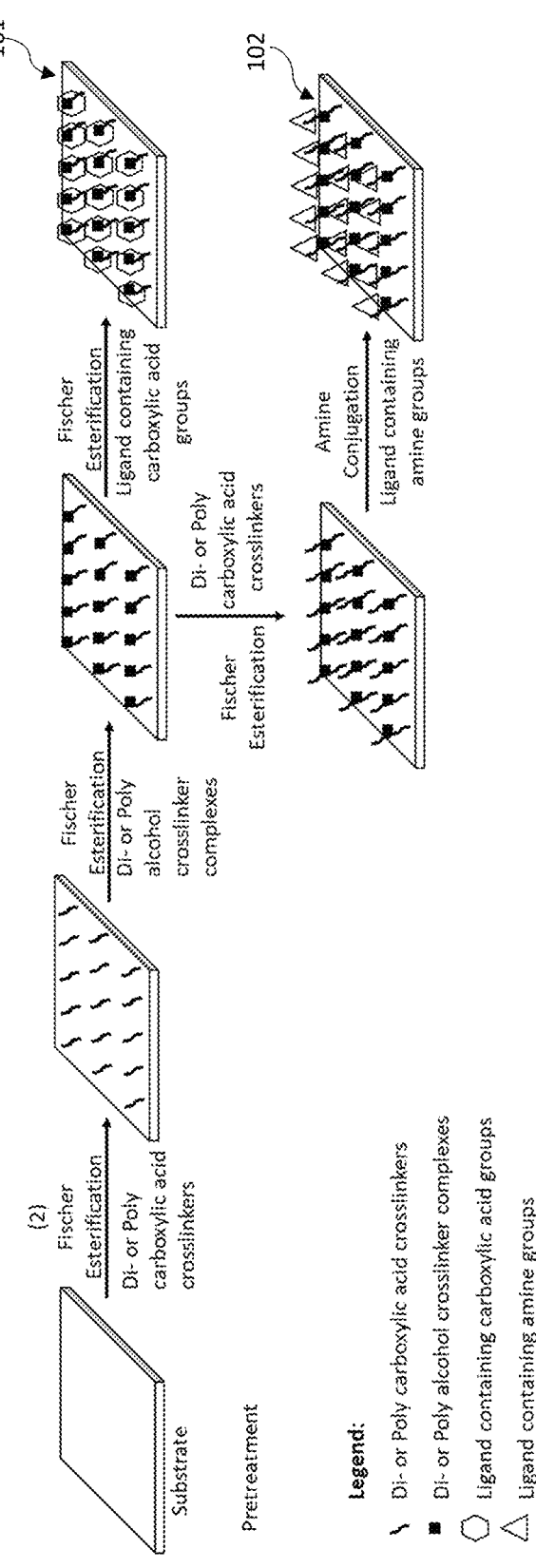
FIG. 1 illustrates the methods of coupling a substrate of an optical waveguide sensor with selected crosslinkers and ligands according to the present invention.

Exemplary embodiments of the present invention will now be described in detail with reference to the annexed drawings. The following detailed description includes the preferred embodiments of the present invention and should be taken as examples, without limiting the scope of the invention.

The term crosslinkers (or crosslinking reagents) refers to molecules that contain two or more reactive ends capable or chemically attaching to specific functional groups (primary amines, sulfhydryls, etc.) on proteins or other molecules.

The term esterification, in particular, Fischer esterification, refers to an organic reaction employed to convert carboxylic acids in presence of excess alcohol and a strong acid catalyst to form an ester as the final product.

The term ligand refers to an ion or molecule that can donate a pair of electrons to a metal ion to form a coordination complex.

The term scintillating agent refers to material that emits fluorescent light upon excitation by an ionizing radiation, such as ionizing radiation from a radioactive isotope.

The present invention provides a method for forming an optical waveguide sensor for detecting various types of ions that potentially contain radioactive isotopes from aqueous solution. The optical waveguide sensor mainly comprises a substrate, coated with a crosslinker, a scintillating agent, and a ligand. In order to form the optical waveguide sensor, the substrate needs to be functionalized by coupling the substrate with the crosslinking agent via esterification, the scintillating agent via esterification, and the ligand via esterification or amine conjugation.

Typically, the substrate is selected from a group comprising silica ($SiO_2$) or silicon (Si). In order to coat the substrate with the crosslinking agent, it is essential to first treat the substrate surface by cleaning the substrate surface with solvents such as acetone and isopropanol, in order to enable reaction on the substrate surface with the crosslinking agent. Additionally, if the silicon substrate is chosen, it is preferred for the silicon substrate to be pre-treated via surface passivation by coating a layer of silicon dioxide, followed by cleaning the pre-treated silicon substrate with acetone and isopropanol. Alternatively, the substrate surface may also be treated by using other solvents such as deionized water and/or ethanol.

Next, the treated substrate is configured to be coated with the crosslinking agent selected from a group comprising carboxylic acid functional group such as di- or poly carboxylic acid molecules, in presence of a tin catalyst such as dibutyltin dilaurate or tin (II) chloride for forming a uniform thin layer of crosslinker surface on the substrate surface, thereby forming the crosslinked substrate surface. The coating of the di- or poly carboxylic acid molecules crosslinker to the substrate surface is preferably done by Fisher esterification. The di- or poly carboxylic acid molecules usable as the crosslinking agent includes malic acid, oxalic acid, glutaric acid, succinic acid, tannic acid or polyacrylic acid. The crosslinking agent is coated to the substrate surface to increase the number of binding sites to facilitate coating of the scintillating agent and the ligand.

The crosslinked substrate surface is then coated with the scintillating agent, selected from a group comprising a fluorescent crosslinker complex, such as a hydroxyl functional group containing organic molecules complexed with ions that can form a fluresceable coordinate complex upon reaction with the hydroxyl functional group containing organic molecule, wherein the ions are preferably selected from a group comprising Europium ions, $Eu^{3+}$, nickel ions, $Ni^{2+}$, or copper ions, $Cu^{2+}$, to form a substrate surface containing scintillating agent. The hydroxyl functional group containing organic molecules can be selected from a group comprising a di- or poly alcohol molecules, such as 7-Dihydroxy-1,10-phenanthroline, polyvinyl alcohol, or Luminol. The scintillating agent is configured to bind into the surface of the crosslinked substrate surface after Fisher esterification is performed for coating the scintillating agent. This is done to enable the molecules of the scintillating agent to emit light upon absorption of ionizing radiations from any ions that contain radioactive isotopes, which are adsorbed on the surface of the substrate surface containing scintillating agent from a source such as aqueous solution containing the radioactive isotopes. The scintillating agent used for the optical waveguide sensor described herein utilises an organic molecule that can be crosslinked with the pre-treated substrate via the Fischer esterification method which can be done at a moderate temperature of 40 to 70° C. Whereas commonly used scintillating materials in the prior art exists in crystal form which requires sintering at a high temperature in order to form a stable coating on the targeted substrates.

Finally, the substrate surface containing the scintillating agent is coated with the ligand, which can be selected from a group comprising carboxylic acid functional group containing organic molecules or an amine functional group for forming a functionalized substrate surface, thereby forming the optical waveguide sensor. The selection of ligand depends on the type of substrate surface and the types of ions to be detected. For example, the carboxylic acid functional group containing organic molecules ligand coated on the substrate surface containing the scintillating agent via Fisher esterification can be selected from a group comprising a 4'-Carboxybenzo-18-crown 6-Ether for detecting radium ion. Further, a Copper-Ethylenediaminetetraacetic (EDTA) acid complex, can be used to detect fluoride ion in the aqueous solution that is exposed to the functionalized substrate surface. The fluoride and radium ions can react with the molecules of the ligand for forming a coordination complex, which shall then induce a change in material optical refractive index of the ligand. When a laser is provided across the optical waveguide sensor, the change of the material optical refractive index can then be measured to detect concentration of the ions. If a radioactive isotope is detected with the ions, the scintillating agent will then react with the ionizing radiation of the radioactive isotope by emitting light, whereby the intensity can then be measured to determine concentration of the radioactive isotope.

For coating with the amine group ligand, it is preferred for the substrate surface containing the scintillating agent to be crosslinked with another di- or poly carboxylic acid molecules selected from a group comprising malic acid, oxalic acid, glutaric acid, succinic acid, tannic acid or polyacrylic acid via Fisher esterification for forming a double crosslinked substrate surface, for enabling coating of the amine functional group ligand, thereby forming a second functionalized substrate surface via amine conjugation using 1-Ethyl-3-(3-dimethylaminopropyl)-carbodiimide) (EDC) and N-Hydroxysuccinimide (NHS). As an example, an amine functional group ligand selected from a group comprising 4'-Aminobenzo-24-crown-8, 4'-Aminobenzo-18-crown-6,4,7,13,16,21,24-Hexaoxa-1,10-diazabicyclo[8.8.8] hexacosane-, or 5,6-Benzo-4,7,13,16,21,24-hexaoxa-1,10-diazabicyclo[8.8.8]hexacos-5-ene-coated on the double crosslinked substrate surface may be used to detect existence of cesium or radium ions, respectively, in an aqueous solution. The cesium or radium ions can react with the molecules of the ligand for forming a coordination complex, which shall then induce a change in material optical refractive index of the ligand. When a laser is provided across the optical waveguide sensor, the change of the material optical refractive index can then be measured to detect concentration of the cesium or radium ions. If a radioactive isotope is detected with the ions, the scintillating agent will then react with the ionizing radiation of the radioactive isotope by emitting light, whereby the intensity can then be measured to determine concentration of the radioactive isotope.

The functionalized substrate surface and the second functionalized substrate surface, which act as ligand of the optical waveguide sensor, is configured to be interactable with a light wave at an input of the optical waveguide sensor and the aqueous solution containing ions that may possess radioactive isotopes, when the aqueous solution is in contact with the functionalized substrate surface or the second functionalized substrate surface. Once the aqueous solution contacts the surface of the functionalized substrate, the ions containing radioactive isotopes in the aqueous solution forms a coordination complex with the functionalized substrate surface as a reaction, thereby adsorbing the elements and the radioactive isotope onto the surface of the functionalized substrate surface. The reaction causes the molecules of the scintillating agent to fluoresce light of varying measurable intensity upon absorbing ionizing radiation energy from the adsorbed radioactive isotope, which can then be measured to calculate the concentration of the radioactive isotope in the aqueous solution. Simultaneously, the adsorption of the ions changes the material optical refractive index of the functionalized substrate surface or the second functionalized substrate surface, which then changes the resonant frequency of the light wave travelling on the functionalized substrate surface or the second functionalized substrate surface, depending on the concentration of the ions containing radioactive isotopes available in the aqueous solution. Measurement of the changing optical refractive index of the functionalized substrate surface and the second functionalized substrate surface can then be made, thereby enabling determination of concentration of ions containing radioactive isotopes in the aqueous solution by measuring the shifting of the resonant frequency of the light wave. If no radioactive isotope is detected, the scintillating agent will not react, as there is no ionizing radiation to provide energy to the molecules of the scintillating agent. The change of the material optical refractive index corresponds to the absorption kinetics and radioactivity of the element and its radioactive isotope.

The more carboxylic acid groups crosslinkers used to coat the substrate surface translates to increase of number of binding sites for the fluorescent crosslinker complexes and the ligands to capture the ions of interest. This in turn tunes the sensitivity and concentration range of the optical waveguide sensor, as increases in binding sites on the optical waveguide sensor will require more ions to bind with the ligands to produce any reaction, in comparison to the optical waveguide sensor with less binding sites, consequently making the optical waveguide sensor less sensitive while increasing the ion detection range. The esterification of the carboxylic acid functional group and the amine conjugation can be repeated multiple times on the substrate surface containing scintillating agent for increasing numbers of the plurality of binding sites on the functionalized silicon substrate and the second functionalized substrate surface, thereby allowing tuning of selectivity and sensitivity of the optical waveguide sensor.

According to another aspect of the invention, there is provided an optical waveguide sensor for detecting ions containing radioactive isotopes in aqueous solution, whereby the optical waveguide sensor is fabricated by the method as described above. The optical waveguide sensor comprises a substrate surface selected from a group comprising silicon or silica, which is coated with a uniform thin layer of crosslinking agent, scintillating agent and ligand for forming a functionalized substrate surface.

Preferably, the substrate surface is coated with the crosslinking agent selected from a group comprising carboxylic acid functional group thereby forming a crosslinked substrate surface. The crosslinked surface is then coated with the scintillating agent comprising a fluorescent crosslinker complex containing di- or poly alcohol molecules such as 7-Dihydroxy-1,10-phenanthroline and Luminol complexed with Europium ions, $Eu^{3+}$, nickel ions, $Ni^{2+}$, and copper ions, $Cu^{2+}$, thereby forming a substrate surface containing scintillating agent. The substrate surface containing scintillating agent is then coated with the ligand via esterification, wherein the ligand is selected from a group comprising carboxylic acid functional group containing organic molecules or an amine functional group. The selection of ligands varies depending on the type of substrate surface and the type of ions containing radioactive isotopes to be detected.

Further, the optical waveguide sensor is configured to be interactable with a light wave provided from an input of the optical waveguide sensor across the functionalized substrate surface together with an aqueous solution containing ions containing radioactive isotopes. The ions containing radioactive isotopes is then adsorbed onto the functionalized substrate surface for determining concentration of ions containing radioactive isotopes in the aqueous solution. The ions containing radioactive isotopes adsorbed on the surface of the functionalized substrate surface may cause the molecules of the scintillating agent to fluoresce upon receiving ionizing radiation from the radioactive isotope. If there is no radioactive isotope, the scintillating agent will not react as there is no ionizing radiation energy to be absorbed by the molecules of the scintillating agent. However, the layer of ligand on the functionalized substrate surface will still react with the ions with or without radioactive isotope, which results in changes of the material optical refractive index of the functionalized substrate surface. The intensity of the fluorescence and change of the material optical refractive index correspond to the concentration of the ions and its radioactive isotope, which can be measured and analysed by connected the optical waveguide sensor to a computing medium containing analysis tools.

With the above description and as illustrated in FIG. 1, it can be understood that the ions containing radioactive isotope can be detected by the optical waveguide sensor that employs either the first functionalized substrate surface 101 or the second functionalized substrate surface 102, depending on the type of ions to be detected, as well as the sensitivity and detection range required by the optical waveguide sensor for detection of ions containing radioactive isotopes in the aqueous solution, such as cesium, fluorine, and radium ion. Once the aqueous solution is in contact with the ligands (the first 101 or the second 102 functionalized substrate surface) of the optical waveguide sensor of the present invention, the ions containing the radioactive isotope then react with the surface of the ligands and adsorbed onto the surface of the ligands. This then changes the material optical refractive index of the ligand, which changes correspond to absorption kinetics of the targeted ions and its radioactive isotope on the ligands. The wavelength of the light wave passing through the ligands will then changes, which can then be measured accordingly. Since different ligands have different absorption kinetics towards the ions and radioactive isotope, the optical waveguide sensor containing the first 101 or the second 102 functionalized substrate surface can be used in parallel for detecting the ions containing radioactive isotope for increasing accuracy in detecting quantity of ions present in the aqueous solution.

Figure 2:
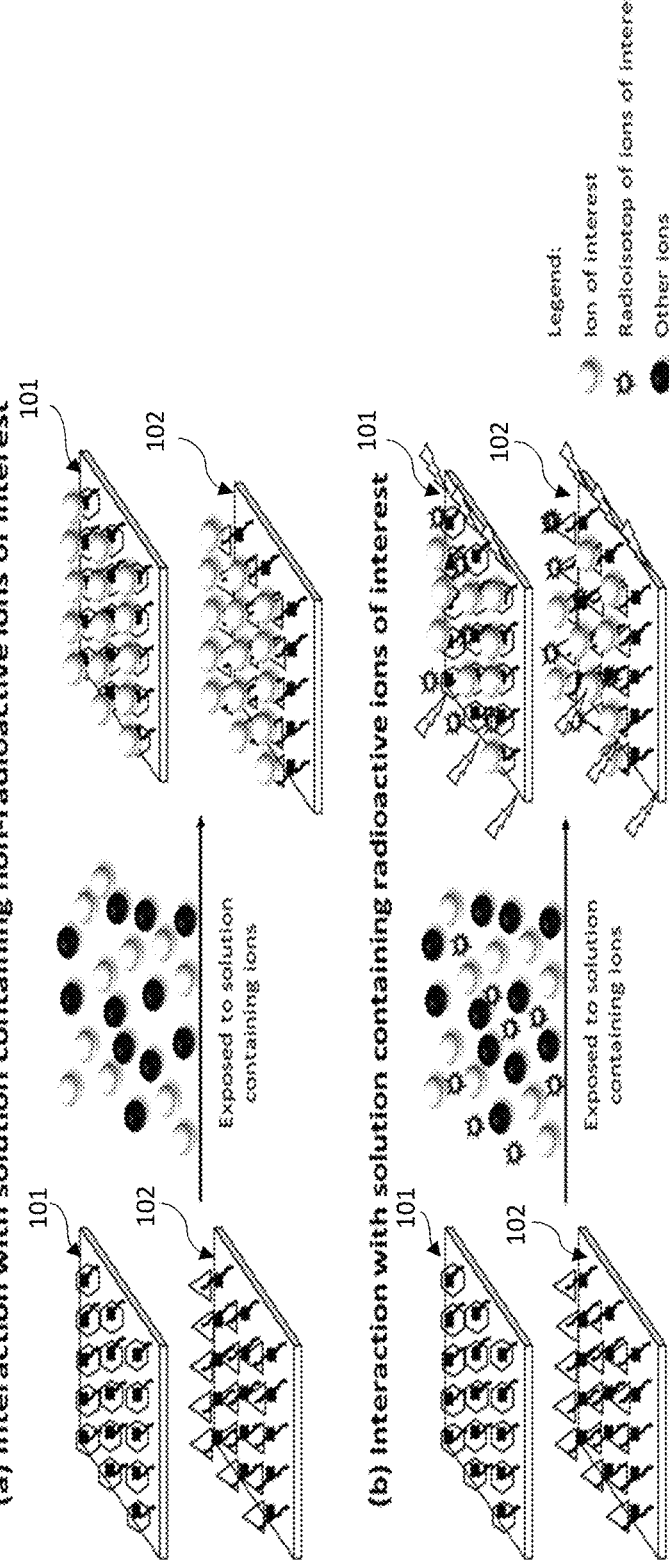
FIG. 2 illustrates the examples of substrates coupled with selected ligands in use for detecting ions containing radioisotope in an aqueous solution according to the present invention.
Figure 3A:
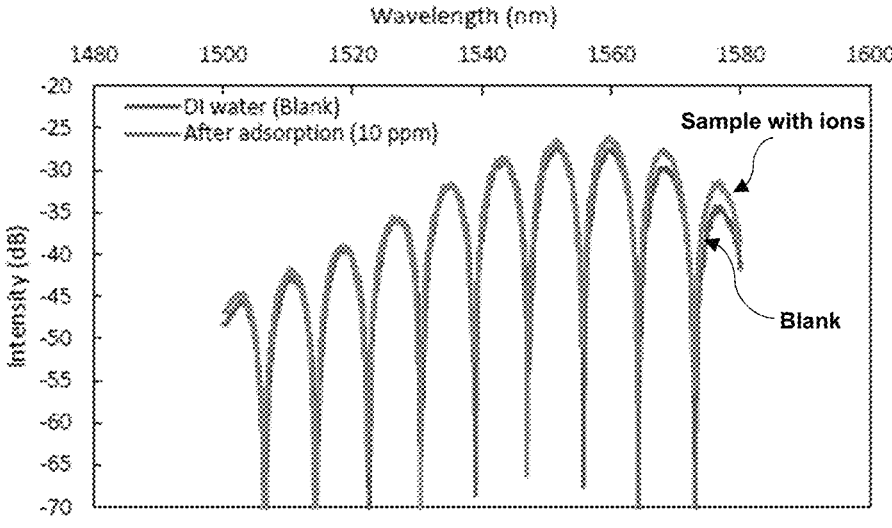
FIGS. 3A and 3B illustrate examples of wavelength shift due to increased ions concentration according to the present invention.
Figure 3B:
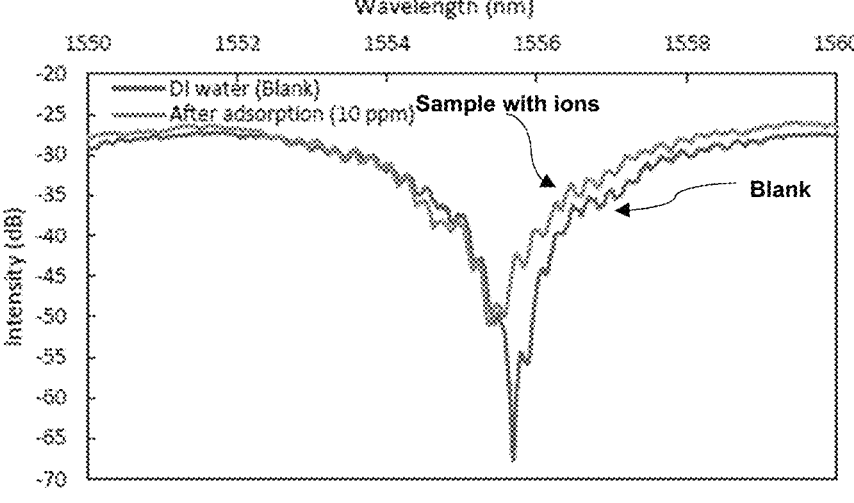

As shown in FIG. 2, the optical waveguide sensor is capable of detecting radioactive isotopes of the ions, as well as ions of interest without radioisotopes. Detection of the radioactive isotopes is made possible by the provision of the scintillating agent coated as a thin layer onto the crosslinked substrate surface. The scintillating agent can be selected from a group comprising fluorescent crosslinker complex, such as 4,7-Dihydroxy-1,10-phenanthroline complexed with Europium ions, $Eu^{3+}$. The scintillating agent molecules is capable of reacting with the adsorbed radioactive isotopes by absorbing the ionizing radiation energy from the radioactive isotopes, which then reacts to the absorbed energy by fluorescing light of varying intensity depending on the concentration of the radioisotopes. The intensity can then be measured to determine concentration of the ions containing radioisotopes and further analysed by the computing medium through the analytic application. 7-Dihydroxy-1, 10-phenanthroline forms a complex with $Eu^{3+}$, to form a coordinate complex that fluoresce when excited by high energy electromagnetic waves such as those emitted from radioactive isotopes. The high energy electromagnetic waves result in the electrons within the complex to be excited to a higher valence state and returned to their original state while emitting the excess energy in the form of visible light.

Preferably, the crosslinking agent and the ligand can be selected with different amount of carboxylic acid groups and hydroxyl groups to react with the carboxylic acid, hydroxyl or amine groups on the ligands. Hence, the amount of carboxylic acid groups and hydroxyl groups determines the amount of ligands present on the sensor. The sensitivity and detection range of the sensor can be tuneable by changing the crosslinkers to change the ligand loading to affect the thickness of the coating layer of the substrate surface. The closer the coating layer is to the surface of the waveguide the more sensitive the sensor is to the ions absorbed. Hence, a thinner layer with less ligands will have a higher sensitivity. However, with a thinner layer, the amount of ions that can be absorbed is also less, thus the layer will be saturated with a smaller amount of ions which translates to a lower detection range.

The optical waveguide sensor may be connected to a computing device to train an artificial neural network to provide information on the ions containing radioactive isotopes present in an aqueous solution such as concentrations of the ions and the radioactive isotopes. This can be done through a deconvolution algorithm stored in an application, which is installed to the computing medium and connected to the optical waveguide sensor. The functionalized substrate surface 101, 102 is integrated to the optical waveguide sensor in order to enable changes in resonant wavelength of the laser passing across the functionalized surface, which shifts according to the change of material index of the ligand due to the adsorption of the ions containing radioactive isotopes on the surface of the functionalized substrate surface 101, 102. Further, in case of detection of any radioisotope, the molecules of the scintillating agent shall fluoresce and the intensity of the light can then be measured. The previously mentioned configuration enables measuring and quantifying of the ions containing radioactive isotopes in the aqueous solution, by detecting the shift in resonant wavelength curves against time curves. The same technique may be used to train artificial neural network for deriving the concentration of the ions and its radioactive isotopes.

Examples of wavelength shifts of the optical waveguide sensor integrated with the functionalized substrate surface due to the change of material index are shown in FIGS. 4A and 4B. Accordingly, as the functionalized substrate surface absorbs the ion, the change in the material index causes a shift in the wavelength, which facilitates in measuring or quantifying the ion concentration in the aqueous solution. The wavelength shifts as the functionalized substrate surface absorbs more ions from an aqueous solution. The presence of ions can be detected within a predetermined exposure time, for example within 20 to 120 seconds. It has been found that the change or wavelength shift does not substantially change further after 120 seconds.

The embodiment of the present invention will now be described with the following examples.

The examples provided herein are intended to illustrate the different aspects and embodiments of the invention. The examples are not intended in any way to limit the disclosed invention, which is limited only by the appended claims.

Example 1

The method of fabricating the sensor involves plasma-enhanced chemical vapor deposition (PECVD) if the substrate selected is silicon at a room temperature and at vacuum pressure of less than 0.1 Torr. Subsequent steps are carried out in atmospheric pressure. For silica and silica coated silicon substrates, the substrates can be cleaned in developing tanks containing IPA and acetone. After which, coating of the di- or poly-carboxylic acid can be done by submerging the substrates in a temperature controlled (40-70° C.) developing tank containing the di- or poly-carboxylic acid. This step is then followed by a washing step to wash the substrates with water and IPA in separate developing tanks. Following which, the scintillating agents which are di- or poly-alcohol complexes can be coated by submerging the substrates in a temperature controlled (40-70° C.) developing tank containing the scintillating agents. This step is then followed by a washing step to wash the substrates with water and IPA in separate developing tanks. After which, the substrates can be coated with the ligand containing carboxylic acid groups by submerging the substrates in a temperature controlled (40-70° C.) developing tank containing the ligand with carboxylic acid groups. Finally, the substrates can be washed using water and IPA in separate developing tanks. The above process flow is as illustrated in FIG. 4A.

Example 2

The method of fabricating the sensor involves plasma-enhanced chemical vapor deposition (PECVD) if the substrate selected is silicon at a room temperature and at vacuum pressure of less than 0.1 Torr. Subsequent steps are carried out in atmospheric pressure. For silica and silica coated silicon substrates, the substrates can be cleaned in developing tanks containing IPA and acetone. After which, coating of the di- or poly-carboxylic acid can be done by submerging the substrates in a temperature controlled (40-70° C.) developing tank containing the di- or poly-carboxylic acid. This step is then followed by a washing step to wash the substrates with water and IPA in separate developing tanks. This step is then followed by a washing step to wash the substrates with water and IPA in separate developing tanks. Following which, the scintillating agents which are di- or poly-alcohol complexes can be coated by submerging the substrates in a temperature controlled (40-70° C.) developing tank containing the scintillating agents. This step is then followed by a washing step to wash the substrates with water and IPA in separate developing tanks. After which, the substrates are then coated with ligands with amine groups, by submerging the substrates in a temperature controlled (4-30° C.) developing tank containing the ligand with amine groups, EDC and NHS. Finally, the substrates can be washed using water and IPA in separate developing tanks. The above process flow is as illustrated in FIG. 4B.

Example 3

The scintillating agent acts as a material to convert the radiation from the radioisotope into an optical signal by fluorescing with an intensity proportional to the strength of the radiation, when exposed to radiation. This optical signal can then be captured by the proposed detector and converted into electrical signal which strength varies proportionally to the strength of the optical signal. Hence, the detector could indirectly measure the amount of radioactive material in a sample. The organometallic scintillating agent 7-Dihydroxy-1,10-phenanthroline complexed with $Eu^{3+}$ provides flexibility in coupling with other organic molecules such as those used in the proposed invention in a mild reaction temperature of 40-70° C. Most common scintillating materials are crystals that requires sintering at high temperature to bind to the target substrate, which makes them unsuitable to be used with the delicate optical waveguides used in the sensor proposed in this invention. Other scintillating agents includes but are not limited to compounds containing phenanthroline and luminol complexed with different metal cations such as $Eu^{3+}$, $Ni^{2+}$ and $Cu^{2+}$. Compounds containing phenanthroline and luminol complexed with metal cations such as Eu3+, Ni2+ and Cu2+ are the preferred scintillating agents as these emit the highest fluorescence intensity with respect to a fixed radioactive source. The use of the aforementioned scintillating agents is preferred due to the complexity of maintaining its scintillating properties while ensuring reaction with the functional layer on the substrate.

Example 4

Table 1 shows a list of examples of possible configurations of the first (101) and second (102) functionalized substrates together with the crosslinkers, scintillating agents and/or ligands used for detecting the ion of interest and its radioisotopes according to an embodiment of the present invention.

TABLE 1

Types of substrates, crosslinkers, scintillating agents and/or ligands used for detecting the specific ions of interest and its radioisotopes.

| | Substrates | Di- or poly-carboxylic acid cross-linkers | Di- or poly-alcohol complexes | Ligands containing amine groups | Ligands containing carboxylic acid groups | Ions of interest |
|---|---|---|---|---|---|---|
| 101 | Si/SiO2 | Malic acid | 7-Dihydroxy-1,10-phenanthroline $Eu^{3+}$ complex | — | 4'-Carboxybenzo-18-crown 6-Ether | Ra |
| | | Maleic acid | 7-Dihydroxy-1,10-phenanthroline $Ni^{2+}$ complex | — | Copper EDTA complex | F |
| | | Succinic acid | 7-Dihydroxy-1,10-phenanthroline $Cu^{2+}$ complex | — | — | — |
| | | Glutaric acid | Polyvinyl alcohol (MW: 9K-186K)-Malic acid-Luminol $Eu^{3+}$ complex-EDC-NHS | — | — | — |
| | | Oxalic acid | Polyvinyl alcohol (MW: 9K-186K)-Malic acid-Luminol $Ni^{2+}$ complex-EDC-NHS | — | — | — |
| | | Tannic acid | Polyvinyl alcohol (MW: 9K-186K)-Malic acid-Luminol $Cu^{2+}$ complex-EDC-NHS | — | — | — |
| | | Poly acrylic acid (MW: 0.45 mil-5 mil) | — | — | — | — |
| 102 | Si/SiO2 | Malic acid | 7-Dihydroxy-1,10-phenanthroline $Eu^{3+}$ complex | 4'-Aminobenzo-24-crown-8 | — | Cs |
| | | Maleic acid | 7-Dihydroxy-1,10-phenanthroline $Ni^{2+}$ complex | 4'-Aminobenzo-18-crown 6-Ether | — | Ra |
| | | Succinic acid | 7-Dihydroxy-1,10-phenanthroline $Cu^{2+}$ complex | 4,7,13,16,21,24-Hexaoxa-1,10-diaza-bicyclo[8.8.8]hexacosane | — | Ra |
| | | Glutaric acid | Polyvinyl alcohol (MW: 9K-186K)-Malic acid-Luminol $Eu^{3+}$ complex-EDC-NHS | 5,6-Benzo-4,7,13,16,21,24-hexaoxa-1,10-diaza-bicyclo[8.8.8]hexacos-5-ene | — | Ra |

TABLE 1-continued

Types of substrates, crosslinkers, scintillating agents and/or ligands used for detecting the specific ions of interest and its radioisotopes.

| Substrates | Di- or poly-carboxylic acid crosslinkers | Di- or poly-alcohol complexes | Ligands containing amine groups | Ligands containing carboxylic acid groups | Ions of interest |
|---|---|---|---|---|---|
|  | Oxalic acid | Polyvinyl alcohol (MW: 9K-186K)-Malic acid-Luminol Ni²⁺ complex-EDC-NHS | — | — | — |
|  | Tannic acid | Polyvinyl alcohol (MW: 9K-186 K - Malic acid-Luminol Cu²⁺ complex-EDC-NHS | — | — | — |
|  | Poly acrylic acid (MW: 0.45 mil-5 mil) | — | — | — | — |

The above-described embodiments of a method to fabricate the optical waveguide sensor only utilizes non-toxic solvents such as water and ethanol. Therefore, the above-described fabrication process may potentially improve sustainability in producing the optical sensor, in comparison to the optical waveguide sensor fabricated with methods of the prior art. Further, the sensitivity of ions and radioactive isotope sensing of the optical waveguide sensor produced by the above-described method may be tuneable, thereby improving portability and simplicity with sensing various ions and radioactive isotope in water, in comparison to inductively coupled plasma atomic emission spectroscopy method, ICP-OES. Further, the method of the present invention improves scalability for mass production of the optical waveguide sensor of the present invention. This is made possible with the use of only two sets of equipment, mainly a PECVD chamber and a developer tank, resulting to a highly versatile method which could be easily performed in series and modified according to the required specifications of the sensor.

Next, the method of the present invention may potentially ease modification of the optical waveguide sensors to cater for different ions and radioactive isotopes. The crosslinkers, scintillating agent, and ligands can be changed along with the temperature of 70° C. for Fischer esterification and 4-30° C. for amine conjugation) with the duration of 30-60 minutes to coat different thin films for different ions and radioisotope. The use of 4,7-Dihydroxy-1,10-phenanthroline complexed with Europium ions, Eu³⁺, as a scintillator and crosslinker eliminates the need of processing the delicate substrate in high temperature upwards of 600° C. The substrate containing the micro- and/or nano-meter scale optical waveguide structure could be damaged by high temperature treatment that is required to sinter commonly found crystalline scintillator material to improve adhesion to the target substrate. The use of organometallic complexes allows for ease of coupling with silicon or silica substrates using the method described in this invention. Also, the method of the present invention eliminates the use of silylating agents which are moisture and pH sensitive and requires more stringent process control and anhydrous solvent. For water soluble reactants, water can be used as the reaction medium which makes the process more environmentally friendly and less toxic and flammable. Further, the optical waveguide sensor of the present invention may utilize the unique absorption kinetics and radioactivity of different radionuclides on the ligands to give a quantitative result of the radionuclides present in the solution analysed. This is achievable through measurement of resonant wavelength shift of the laser passed across the functionalized substrate surface of the optical waveguide sensor over time, which could then be deconvoluted via the computing medium, which can be a personal computer or a smart device such as smartphones.

While the invention has been described as required in terms in preferred embodiments and specific operating ranges and conditions, those skilled in the art will appreciate that the invention described herein is susceptible to variations and modifications other than those specifically described.

The invention claimed is:

1. A method for forming an optical waveguide sensor for detecting ions containing radioactive isotopes in an aqueous solution, the method comprising the steps of:

treating a substrate surface by cleaning the substrate surface with one or more solvents for enabling coating of the treated surface with a crosslinking agent, the substrate being selected from a group comprising a silica or a silicon substrate;

coating the treated substrate surface with the crosslinking agent selected from a group comprising carboxylic acid functional group containing organic molecules for forming a crosslinked substrate surface;

coating the crosslinked substrate surface with a scintillating agent for forming a substrate surface containing scintillating agent; and coating the substrate surface containing scintillating agent with a ligand capable of reacting with a radioactive isotope in an aqueous solution for forming a functionalized substrate surface, thereby forming the optical waveguide sensor comprising a layer of the ligand and the scintillating agent, characterized in that, the coating of the treated substrate surface with the crosslinking agent is performed using a tin catalyst;

the scintillating agent is selected from a group comprising a fluorescent crosslinker complex selected from a group comprising a hydroxyl functional group containing organic molecules complexed with ions selected from a group comprising Europium ions, Eu³⁺, nickel ions, Ni²⁺, or copper ions, Cu²⁺; and the ligand is selected from a group comprising carboxylic acid functional group containing organic molecules or an amine functional group ligand, wherein the selection of the ligand varies depending on the type of substrate surface and the types of ions containing radioactive isotopes to be detected, wherein the optical waveguide sensor is configured to be interactable with a light wave passing through the optical waveguide sensor from an input and an aqueous solution for determining concentration of the ions containing radioactive isotope in the aqueous solution, whereby, upon adsorption of the ions containing the radioactive isotope from the aqueous solution on the surface of the optical waveguide sensor, the molecules of the scintillating agent fluoresce in response to the ionizing radiation from the radioactive isotope of varying measurable intensity, and triggers a measurable change in material optical refractive index of the ligand of the functionalized substrate surface, which change corresponds to the absorption kinetics and radioactivity of the ions and its radioactive isotope.

2. The method according to claim 1, wherein the one or more solvents is selected from the group comprising deionized water, ethanol, acetone, isopropanol, or combination thereof.

3. The method according to claim 1, wherein the silicon substrate is further treated by coating a layer of silicon dioxide on the silicon substrate surface, prior to cleaning the substrate surface.

4. The method according to claim 3, wherein the silicon substrate is coated with the crosslinking agent comprising di- or poly carboxylic acid molecules.

5. The method according to claim 4, wherein the di- or poly carboxylic acid molecules is selected from a group comprising malic acid, oxalic acid, glutaric acid, succinic acid, tannic acid or polyacrylic acid, via esterification, for forming the crosslinked substrate surface.

6. The method according to claim 1, wherein the hydroxyl functional group containing organic molecules is selected from a group comprising 7-Dihydroxy-1,10-phenanthroline or Luminol.

7. The method according to claim 1, wherein the ligand comprising carboxylic acid functional group containing organic molecules is selected from a group comprising a 4'-Carboxybenzo-18-crown 6-Ether or a Copper-Ethylenediaminetetraacetic acid complex.

8. The method according to claim 7, wherein the ions containing radioactive isotopes detectable by the functionalized substrate surface is selected from the group comprising radium or fluoride, which are adsorbed by the functionalized substrate surface upon exposure to the ions from the aqueous solution, consequently changing the material optical refractive index of the functionalized substrate surface.

9. The method according to claim 1, further comprising the steps of coating the substrate surface containing scintillating agent with another di- or poly carboxylic acid molecules selected from a group comprising malic acid, oxalic acid, glutaric acid, succinic acid, tannic acid or polyacrylic acid via esterification for forming a double crosslinked substrate surface for enabling coating of an amine functional group ligand for forming a second functionalized substrate surface, wherein the amine functional group ligand is selected from a group comprising 4'-Aminobenzo-24-crown-8, 4'-Aminobenzo-18-crown-6,4,7,13,16,21,24-Hexaoxa-1,10-diazabicyclo[8.8.8]hexacosane-, or 5,6-Benzo-4,7,13,16,21,24-hexaoxa-1,10-diazabicyclo[8.8.8] hexacos-5-ene-.

10. The method according to claim 9, wherein the amine group is coated to the double crosslinked substrate surface via amine conjugation using 1-Ethyl-3-(3-dimethylamino-propyl)-carbodiimide) (EDC) and N-Hydroxysuccinimide (NHS).

11. The method according to claim 10, wherein the ions containing radioactive isotopes detectable by the optical waveguide sensor containing the amine functional group ligand is selected from the group comprising cesium, or radium which are adsorbed by the second functionalized substrate surface, consequently changing the material optical refractive index of the second functionalized substrate surface.

12. The method according to claim 10, wherein the esterification or the amine conjugation steps are repeatable for increasing numbers of binding sites on the functionalized silicon substrate and the second functionalized silicon substrate.

13. The method according to claim 1, wherein the scintillating agent is coated to the crosslinked substrate surface via esterification.

14. An optical waveguide sensor for detecting ions containing radioactive isotopes in aqueous solution, wherein the optical wave guide sensor is fabricated by the steps of:

treating a substrate surface by cleaning the substrate surface with one or more solvents for enabling coating of the treated surface with a crosslinking agent, the substrate being selected from a group comprising a silica or a silicon substrate;

coating the treated substrate surface with the crosslinking agent selected from a group comprising carboxylic acid functional group containing organic molecules for forming a crosslinked substrate surface;

coating the crosslinked substrate surface with a scintillating agent for forming a substrate surface containing scintillating agent; and coating the substrate surface containing scintillating agent with a ligand capable of reacting with a radioactive isotope in an aqueous solution for forming a functionalized substrate surface, thereby forming the optical waveguide sensor comprising a layer of the ligand and the scintillating agent, characterized in that, the coating of the treated substrate surface with the crosslinking agent is performed using a tin catalyst;

the scintillating agent is selected from a group comprising a fluorescent crosslinker complex selected from a group comprising a hydroxyl functional group containing organic molecules complexed with ions selected from a group comprising Europium ions, $Eu^{3+}$, nickel ions, $Ni^{2+}$, or copper ions, $Cu^{2+}$; and the ligand is selected from a group comprising carboxylic acid functional group containing organic molecules or an amine functional group ligand, wherein the selection of the ligand varies depending on the type of substrate surface and the types of ions containing radioactive isotopes to be detected, wherein the optical waveguide sensor is configured to be interactable with a light wave passing through the optical waveguide sensor from an input and an aqueous solution for determining concentration of the ions containing radioactive isotope in the aqueous solution, whereby, upon adsorption of the ions containing the radioactive isotope from the aqueous solution on the surface of the optical waveguide sensor, the molecules of the scintillating agent fluoresce in response to the ionizing radiation from the radioactive isotope of varying measurable intensity, and triggers a measurable change in material optical refractive index of the ligand of the functionalized substrate surface, which change corresponds to the absorption kinetics and radioactivity of the ions and its radioactive isotope.

15. An optical waveguide sensor for detecting ions containing radioactive isotopes in aqueous solution comprising:

a substrate surface having a uniform thin layer of crosslinking agent, scintillating agent and ligand coupled thereto for forming a functionalized substrate surface, the substrate being selected from a group comprising a silica or a silicon substrate;

characterized in that, the substrate surface is coated with the crosslinking agent selected from a group comprising carboxylic acid functional group containing organic molecules;

the substrate surface is coated with the scintillating agent comprising a fluorescent crosslinker complex containing di- or poly alcohol molecules complexed with ions selected from a group comprising Europium ions, $Eu^{3+}$, nickel ions, $Ni^{2+}$, or copper ions, $Cu^{2+}$;

the substrate surface coated with the scintillating agent is coupled with the ligand via esterification, wherein the ligand is selected from a group comprising carboxylic acid functional group containing organic molecules or an amine functional group, whereby the selection of the ligand varies depending on the type of substrate surface and the type of ions containing radioactive isotopes to be detected, and wherein the optical waveguide sensor is configured to be interactable with a light wave from an input of the optical waveguide sensor and an aqueous solution in contact with the functionalized substrate surface for determining concentration of ions containing radioactive isotopes in the aqueous solution, whereby the ions containing radioactive isotopes in the aqueous solution are adsorbed by the functionalized substrate surface, causing the molecules of the scintillating agent to fluoresce upon receiving ionizing radiation from the radioactive isotope, and changing the material optical refractive index of the functionalized substrate surface, wherein the change of the material optical refractive index and fluorescence correspond to the concentration of the ions and its radioactive isotope.

16. The sensor according to claim 15, wherein the carboxylic acid functional group containing organic molecules is coupled to the substrate through esterification for forming a crosslinked substrate surface, thereby enabling coating of the crosslinked substrate surface with a scintillating agent for forming a substrate surface containing scintillating agent via another esterification.

17. The sensor according to claim 16, wherein the substrate surface containing scintillating agent is coated with the ligand selected from the group comprising a carboxylic acid functional group containing organic molecules for forming a functionalized substrate surface or the amine functional group for forming a second functionalized substrate surface.

* * * * *